United States Patent
Du et al.

(10) Patent No.: US 10,852,340 B2
(45) Date of Patent: Dec. 1, 2020

(54) VEHICLE ELECTRONICS HIGH-RESISTANCE FAULT DETECTION AND ISOLATION

(71) Applicant: GM GLOBAL TECHNOLOGY OPERATIONS LLC, Detroit, MI (US)

(72) Inventors: Xinyu Du, Oakland Township, MI (US); Wen-Chiao Lin, Rochester Hills, MI (US); Yilu Zhang, Northville, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 142 days.

(21) Appl. No.: 16/196,023

(22) Filed: Nov. 20, 2018

(65) Prior Publication Data
US 2020/0158772 A1  May 21, 2020

(51) Int. Cl.
| | |
|---|---|
| *G01R 31/00* | (2006.01) |
| *B60L 3/00* | (2019.01) |
| *G01R 31/3842* | (2019.01) |
| *G01R 31/66* | (2020.01) |
| *G08B 25/00* | (2006.01) |
| *G08B 21/18* | (2006.01) |

(52) U.S. Cl.
CPC .......... *G01R 31/007* (2013.01); *B60L 3/0069* (2013.01); *B60L 3/0084* (2013.01); *G01R 31/3842* (2019.01); *G01R 31/66* (2020.01); *G08B 21/182* (2013.01); *G08B 25/00* (2013.01)

(58) Field of Classification Search
None
See application file for complete search history.

(56) References Cited

U.S. PATENT DOCUMENTS

| | | | | |
|---|---|---|---|---|
| 7,705,602 B2 * | 4/2010 | Bertness | ............. | H02J 7/00041 324/426 |
| 8,315,829 B2 * | 11/2012 | Zhang | ............... | H01M 10/4207 702/63 |
| 8,749,350 B2 * | 6/2014 | Geisler | ................... | H04W 4/90 340/8.1 |
| 8,831,816 B2 * | 9/2014 | Kwon | .................... | G01R 31/52 701/29.2 |
| 9,000,771 B2 * | 4/2015 | Owens | .................. | G01R 31/52 324/503 |
| 9,601,879 B1 | 3/2017 | Lin et al. | | |

(Continued)

*Primary Examiner* — Jermele M Hollington
(74) *Attorney, Agent, or Firm* — Reising Ethington, P.C.

(57) ABSTRACT

A vehicle electronics high-resistance fault diagnosis system is provided, as well as a method of detecting and isolating a high-resistance fault in vehicle electronics of a vehicle. The method includes the steps of determining electrical data for one or more portions of the vehicle electronics, wherein the electrical data includes voltage data and/or current data concerning the one or more portions of the vehicle electronics; calculating a resistance for a plurality of resistance sets of the vehicle electronics based on the electrical data, wherein each of the plurality of resistance sets includes one or more electrical components; obtaining a resistance set threshold for each of the plurality of resistance sets of the vehicle electronics; for each of the plurality of resistance sets, evaluating whether the resistance of the resistance set exceeds the resistance set threshold; and based on the evaluating step, identifying one or more high-resistance fault candidates.

18 Claims, 3 Drawing Sheets

(56) References Cited

U.S. PATENT DOCUMENTS

| | | | |
|---|---|---|---|
| 10,215,148 B2* | 2/2019 | Jiang | F02N 11/108 |
| 2010/0123465 A1* | 5/2010 | Owens | G01R 31/52 |
| | | | 324/503 |
| 2012/0262180 A1* | 10/2012 | Ishishita | G01R 31/396 |
| | | | 324/430 |
| 2016/0261127 A1* | 9/2016 | Worry | H01M 10/4207 |
| 2020/0066066 A1* | 2/2020 | Hu | F02D 41/3082 |

* cited by examiner

VEHICLE ELECTRONICS HIGH-RESISTANCE FAULT DETECTION AND ISOLATION

TECHNICAL FIELD

The present disclosure relates generally to detecting faults in electronic systems and, in particular, to detecting and isolating high-resistance faults in vehicle electronics systems.

BACKGROUND

Vehicles include various electronic control units (ECUs) that carry out various tasks for the vehicle. For example, many automotive vehicles include a starter circuit that can be used to start an internal combustion engine. Also, many automotive vehicles include electronic power steering (EPS) modules that aid in turning wheels (or otherwise steering) of the vehicle. The EPS and the starter circuit are typically connected to a vehicle battery that is used to provide electrical power to a variety of vehicle components. The electrical components of the vehicle electronics can wear and become faulty resulting in a high-resistance fault, which is a scenario where the resistance of the electrical circuit (or part thereof) is higher than a threshold resistance value for that electric circuit (or part thereof). Isolating the particular component, module, or even subsystem that is causing the high-resistance fault can be difficult due to the complexities of the vehicle electronics.

Thus, it may be desirable to provide a system and/or method for detecting high-resistance faults and/or identifying the component, module, or subsystem that is causing or experiencing the high-resistance fault.

SUMMARY

According to one aspect, there is provided a method of detecting and isolating a high-resistance fault in vehicle electronics of a vehicle. The method includes the steps of determining electrical data for one or more portions of the vehicle electronics, wherein the electrical data includes voltage data and/or current data concerning the one or more portions of the vehicle electronics; calculating a resistance for a plurality of resistance sets of the vehicle electronics based on the electrical data, wherein each of the plurality of resistance sets includes one or more electrical components; obtaining a resistance set threshold for each of the plurality of resistance sets of the vehicle electronics; for each of the plurality of resistance sets, evaluating whether the resistance of the resistance set exceeds the resistance set threshold; and based on the evaluating step, identifying one or more high-resistance fault candidates, wherein the one or more high-resistance fault candidates includes at least one of the electrical component(s) from one or more of the resistance sets.

According to various embodiments, the method may further include any one of the following features or any technically-feasible combination of some or all of these features:
  the determining step includes using an onboard vehicle sensor to measure a current of at least some of the one or more portions of the vehicle electronics;
  the determining step includes using an onboard vehicle sensor to measure a voltage of at least some of the one or more portions of the vehicle electronics;
  the one or more portions of the vehicle electronics are provided electrical power by a vehicle battery that is a part of the vehicle electronics, and wherein the measured voltage is a vehicle battery voltage that is measured using the onboard vehicle sensor;
  the determining step includes estimating at least some of the electrical data based on a known circuit configuration of the one or more portions of the vehicle electronics;
  at least one of the resistance sets includes a plurality of electrical components;
  at least one electrical component of the plurality of electrical components of the at least one resistance set is a member of another one of the resistance sets;
  the method further includes creating a high-resistance candidate set and a normal-resistance candidate set based on the evaluating step, and wherein the identifying step further includes filtering down the high-resistance candidate set based on the normal-resistance candidate set to obtain a filtered high-resistance candidate set;
  the resistance set thresholds are obtained from memory included as a part of the vehicle electronics;
  at least one of the resistance set thresholds is obtained based on a measured or calculated resistance value for the resistance set at a time prior to carrying out the method and when an overall mileage of the vehicle is below a predetermined threshold, and wherein the at least one resistance set threshold is stored in the memory;
  at least one of the resistance set thresholds is determined based on engineering specifications of the vehicle electronics and is stored in the memory;
  at least one of the resistance set thresholds is obtained at the vehicle electronics from a remote server;
  the at least one resistance set threshold is determined based on onboard sensor data from a plurality of vehicles, and wherein the plurality of vehicles include a similar vehicle electronics architecture as the vehicle; and/or
  the vehicle electronics includes an electronic controller, wherein the electronic controller includes a processor and memory, and wherein the processor is configured to carry out the method based on computer instructions stored in the memory.

According to another aspect, there is provided a method of detecting and isolating a high-resistance fault in vehicle electronics of a vehicle. The method includes the steps of: determining electrical data for one or more portions of the vehicle electronics, wherein the electrical data includes voltage data and/or current data concerning a battery and a target vehicle system module (VSM) of the vehicle electronics; calculating a resistance for a plurality of resistance sets of the vehicle electronics based on the electrical data; obtaining a resistance set threshold for each of the plurality of resistance sets of the vehicle electronics; for each of the plurality of resistance sets, evaluating whether the resistance of the resistance set exceeds the resistance set threshold; based on the evaluating step, populating a high-resistance candidate set that includes one or more electrical components of each resistance set that is determined to have exceeded the resistance set threshold; and identifying one or more high-resistance fault candidates, wherein the one or more high-resistance fault candidates includes at least one of the electrical component(s) from one or more of the resistance sets determined to have exceeded the resistance set threshold.

According to various embodiments, the method may further include any one of the following features or any technically-feasible combination of some or all of these features:
- notifying a vehicle user via one or more vehicle-user interfaces installed as a part of the vehicle electronics of the vehicle;
- sending a notification to a backend vehicle services facility via use of a vehicle communications module installed as a part of the vehicle electronics of the vehicle;
- the vehicle communications module is a telematics unit; and/or
- normalizing the calculated resistances based on a temperature of the vehicle or an ambient temperature of the vehicle.

BRIEF DESCRIPTION OF THE DRAWINGS

One or more embodiments of the disclosure will hereinafter be described in conjunction with the appended drawings, wherein like designations denote like elements, and wherein.

DETAILED DESCRIPTION OF THE ILLUSTRATED EMBODIMENT(S)

The vehicle electronics high-resistance fault diagnosis system and method provided herein enables detection and isolation of high-resistance faults in vehicle electronics of a vehicle. In at least some embodiments, the method generally includes obtaining electrical data (e.g., voltage data, current data) concerning one or more portions of the vehicle electronics, determining resistances for a plurality of resistance sets (which each correspond to a portion of the vehicle electronics), evaluating the resistance sets by comparing the determined resistances to resistance set thresholds, and identifying high-resistance set candidates based on the evaluations. Thus, if it is determined that a resistance of a resistance set has exceeded the (associated) resistance set threshold, then it can be determined that at least one electrical component of that resistance set is the cause of (or at least contributes to) the high-resistance fault.

In one embodiment, a single electrical component (e.g., an electrical wire connector) can be a part of multiple resistance sets, such as a first resistance set and a second resistance set. Based on the evaluating step, it can be determined that the first resistance set has exceeded the high-resistance threshold, and that the second resistance set has not exceeded the high-resistance threshold. Thus, the electrical component(s) that are a part of the second resistance set (whether they are a part of the second resistance set only or a part of both the first and second resistance sets) can be eliminated from a high-resistance candidate set so as to obtain a filtered (or final) high-resistance candidate set since those electrical component(s) were determined to be part of a portion of the vehicle electronics that did not experience a high-resistance, which is the second resistance set in this example.

Figure 1:
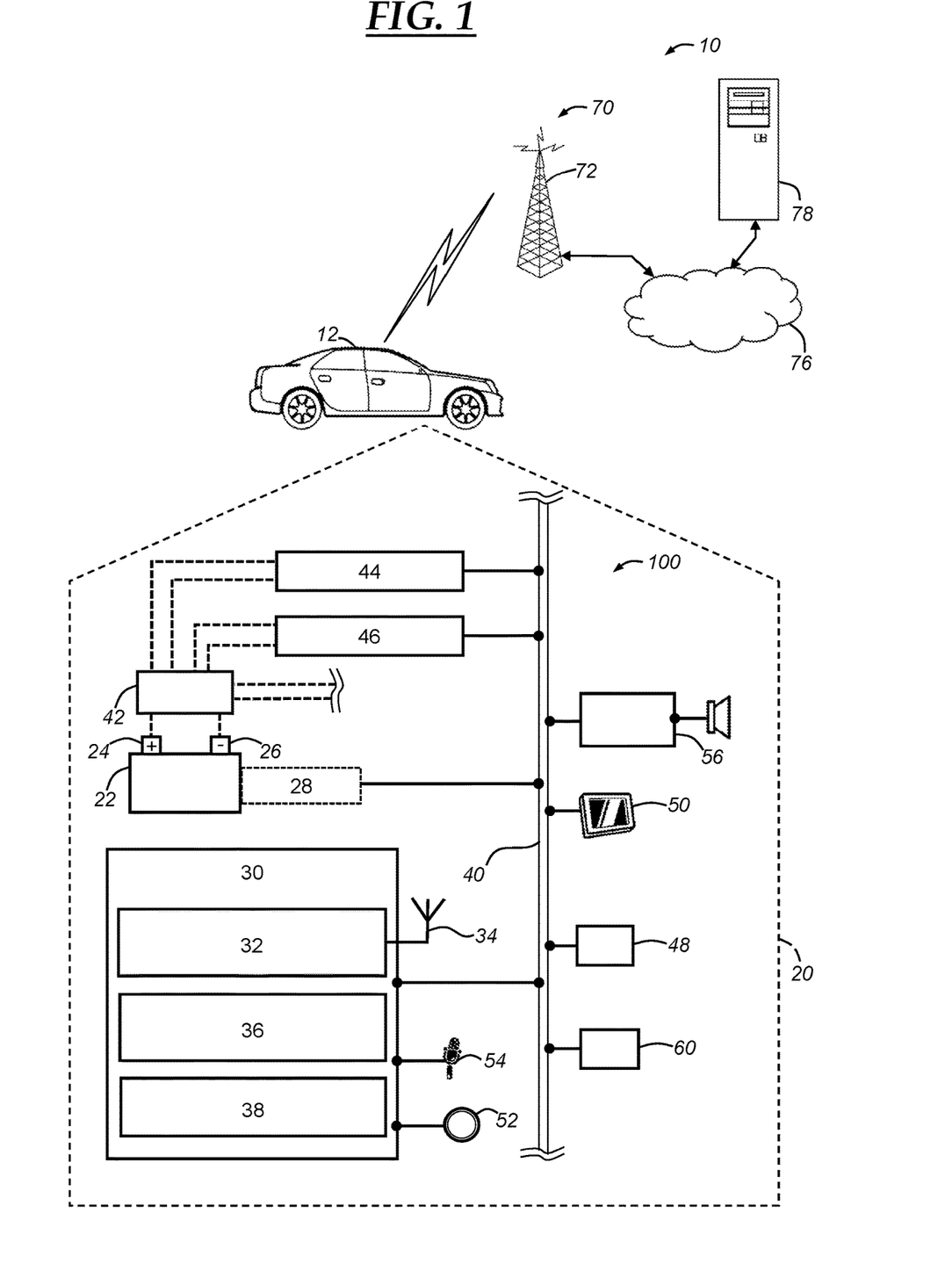
FIG. 1 is a block diagram depicting an embodiment of a communications system that is capable of utilizing the method disclosed herein.

FIG. 1 illustrates an operating environment that comprises a communications system 10 and that can be used to implement the method disclosed herein. Communications system 10 generally includes a vehicle 12 with a vehicle electronics high-resistance fault diagnosis system 100, one or more wireless carrier systems 70, a land communications network 76, and a remote computer or server 78. It should be understood that the disclosed method can be used with any number of different systems and is not specifically limited to the operating environment shown here. Thus, the following paragraphs simply provide a brief overview of one such communications system 10; however, other systems not shown here could employ the disclosed method as well.

The high-resistance fault diagnosis system 100 can be onboard the vehicle 12 and can include one or more vehicle system modules (VSMs) of the vehicle electronics 20. For example, the vehicle 12 can be configured to include the high-resistance fault diagnosis system 100 as a part of manufacturing of the vehicle 12. Or, in another example, the vehicle 12 can be sent computer instructions from a remote server 78 that can be installed to the vehicle electronics 20. In another embodiment, the high-resistance fault diagnosis system 100 can be an electronic module that is separate from the vehicle electronics 20, such as an electronic specialized tool that can be provided to vehicle technicians. This specialized tool can be a vehicle diagnostic tool that is configured to obtain electrical data for one or more portions of the vehicle electronics 20 via a hardwired (or wireless) connection to the vehicle electronics 20. For example, the tool can include an onboard diagnostic (OBD) connection (e.g., an OBD II connector) that connects with an OBD port of the vehicle electronics 20. This can provide the tool with a connection to the vehicle bus 40. Vehicle information, such as resistance set thresholds for various components of the vehicle 12, can be provided to the tool via a connection with the remote server or computer 78 or via the connection with the vehicle electronics 20.

Vehicle 12 is depicted in the illustrated embodiment as a passenger car, but it should be appreciated that any other vehicle including motorcycles, trucks, sports utility vehicles (SUVs), recreational vehicles (RVs), marine vessels, aircraft including unmanned aerial vehicles (UAVs), etc., can also be used. Portions of the vehicle electronics 20 are shown generally in FIG. 1 and include a vehicle battery 22, battery management system 28, a vehicle communications module 30, a fuse box 42, an electronic power steering (EPS) module 44, a starter circuit 46, a body control module (BCM) 48, vehicle-user interfaces 50-56, and other VSMs 60. Some or all of the different vehicle electronics may be connected for communication with each other via one or more communication busses, such as communications bus 40. The communications bus 40 provides the vehicle electronics with network connections using one or more network protocols and can use a serial data communication architecture. Examples of suitable network connections include a controller area network (CAN), a media oriented system transfer (MOST), a local interconnection network (LIN), a local area network (LAN), and other appropriate connections such as Ethernet or others that conform with known ISO, SAE, and IEEE standards and specifications, to name but a few.

Although FIG. 1 depicts some exemplary vehicle system modules (VSMs), the vehicle 12 can also include other VSMs 60 in the form of electronic hardware components that are located throughout the vehicle and, which may receive input from one or more sensors and use the sensed input to perform diagnostic, monitoring, control, reporting, and/or other functions. Each of the VSMs (e.g., other VSMs 60, BMS 28, the vehicle communications module 30) can be connected by communications bus 40 to other VSMs, and may be programmed to run vehicle system and subsystem diagnostic tests. Moreover, each of the VSMs can include and/or be communicatively coupled to suitable hardware that enables intra-vehicle communications to be carried out over the communications bus 40; such hardware can include, for example, bus interface connectors and/or modems. Also, any one or more of the VSMs can be a stand-alone module or incorporated into another VSM, and any one or more of the VSMs can include their own processor and/or memory, or may share a processor and/or memory with other VSMs. As is appreciated by those skilled in the art, the above-mentioned VSMs are only examples of some of the modules that may be used in vehicle 12, as numerous others are also possible.

Battery 22 is a vehicle battery that provides direct current (DC) power to one or more VSMs or electrical components thereof. Here, for example, the battery 22 may provide voltage in the range of 10V to 40V, such as are included in many passenger land vehicles, such as vehicle 12. In another embodiment, the battery 22 may be a primary propulsion battery used in an electric vehicle (EV), a hybrid electric vehicle (HEV), or any derivative thereof. In at least some embodiments where an EV is used, an inverter (or other suitable electronic module or component) can be included so as to convert the voltage of the EV battery (or traction battery) to 12V or other suitable voltage for usage by various accessory VSMs (or non-propulsion system VSMs). The battery 22 includes a positive terminal 24 and a negative terminal 26. Also, the battery 22 is coupled to a battery management system (BMS) 28 that can be used to monitor conditions or measure parameters of the battery 22, such as battery temperature or electrical data of the battery 22. As used herein, "electrical data" broadly includes data that represents one or more electrical properties of a particular electrical component of the vehicle electronics. For example, electrical data of the battery 22 can include a battery voltage, a battery current, a battery resistance, a battery state of charge (SoC), battery state of health (SoH), etc. An electrical component refers to any component that is a part of an electrical circuit of the vehicle electronics, such as an electrical wire connector, a resistor, a capacitor, a transistor, a battery, an inductor, a diode, a transducer, a sensor, an antenna, or any combination or collection thereof. In at least some embodiments, a generator can be provided that is parallel to the battery 22 and that can be used to provide electricity to various portions (including any or all VSMs) of the vehicle electronics 20.

In one embodiment, the BMS 28 includes one or more battery sensors and a battery controller. The battery sensors of the BMS 28 may output battery sensor signals to the battery controller. These battery sensor signals can be used by the battery controller in managing the battery, and these signals can be stored in memory of the BMS 28 or other memory of the vehicle electronics 20. In one embodiment, the battery sensors include a battery voltage sensor that measures the voltage of the battery and a battery current sensor that measures the current of the battery. Also, battery information relating to pertinent battery characteristics and background information pertaining to the battery's cell chemistry, cell capacity, upper and lower battery voltage limits, battery current limits, battery temperature limits, temperature profiles, battery impedance, number or history of charge/discharge events, etc., can also be stored on the memory of the BMS 28 or memory of another VSM. In one embodiment, the BMS 28 can act as the controller of the vehicle electronics high-resistance fault diagnosis system 100.

Fuse box 42 is a module or compartment and includes one or more fuses that protect one or more electrical circuits of the vehicle electronics 20. In one embodiment, the fuse box 42 can be an interior fuse compartment or panel that is located within an interior cabin of the vehicle 12, such as within or under the dashboard of the vehicle 12. In another embodiment, the fuse box 20 can be an engine-compartment fuse box or panel that holds fuses for one or more VSMs or components that are located in the engine compartment. The fuse box 42 can include one or more fuse ports that are each configured to receive a fuse (e.g., a motor vehicle fuse). As depicted in FIG. 1, the fuse box 42 is connected to the positive terminal 24 and the negative (or ground) terminal 26 of the battery 22. In other embodiments, the negative terminal 26 can be connected to the ground (vehicle frame) directly and the positive terminal 24 is connected to the fuse box 42. Also, the fuse box 42 is shown as being connected to the EPS 44 and the starter circuit 46. The fuse box 42 can also be connected to a variety of other VSMs, such as the BMS 28, the vehicle communications module 30, the BCM 48, vehicle-user interfaces 50-56, and other VSMs 60, as indicated by the truncated wiring lines that are connected to the right side of the illustrated fuse box 42.

The electronic power steering (EPS) module 44 can be connected to and help control a motor that provides assistance for steering of the vehicle 12. The EPS 44 can be connected to the fuse box using one or more connectors, such as an EPS 2-way connector (EPC), an EPS ground connector (EGC), and an EPS+Mega Fuse Connector (EMFC), which are illustrated in the exemplary embodiment of FIG. 3.

The starter circuit 46 can be a system that is used to provide electric power to a starter motor that is used for starting the vehicle. For example, when an ignition key is positioned to the START position, electric power can be provided to the starter motor from the battery 22. The starter circuit 46 can be connected to the fuse box using one or more connectors, such as a starter circuit connector (SPC), a starter circuit ground connector (SGC), and a starter circuit Mega Fuse Connector (SMFC1), which are illustrated in the exemplary embodiment of FIG. 4.

Body control module (BCM) 48 can be used to control various VSMs of the vehicle, as well as obtain information concerning the VSMs, including their present state or status, which can be in the form of or based on sensor information. In one embodiment, the BCM 48 can act as the controller of the vehicle electronics high-resistance fault diagnosis system 100. In such a case, the BCM 48 may include a processor and memory accessible by the processor. Software stored in the memory and executable by the processor enables the BCM to carry out one or more steps of the method discussed below.

Vehicle communications module 30 provides the vehicle with short range and/or long range wireless communication capabilities so that the vehicle can communicate and exchange data with other devices or systems that are not a part of the vehicle electronics, such as the remote computer 78. The vehicle communications module 30 includes a wireless transceiver 32, which can be a cellular chipset that enables cellular (i.e., long-range) wireless communications.

Additionally or alternatively, the wireless transceiver 32 can be or include a short range wireless communications (SRWC) circuit that enables short-range wireless communications with any number of nearby devices (e.g., Bluetooth™, other IEEE 802.15 communications, Wi-Fi™, other IEEE 802.11 communications, vehicle-to-vehicle communications, etc.). The vehicle communications module 30 also includes an antenna 34 that can be used to transmit and receive these wireless communications. The vehicle communications module 30 also includes a processor 36 and memory 38. In one embodiment, the vehicle communications module 30 can act as the controller of the vehicle electronics high-resistance fault diagnosis system 100.

Vehicle electronics 20 also includes a number of vehicle-user interfaces that provide vehicle occupants with a means of providing and/or receiving information, including visual display 50, pushbutton(s) 52, microphone 54, and audio system 56. As used herein, the term "vehicle-user interface" broadly includes any suitable form of electronic device, including both hardware and software components, which is located on the vehicle and enables a vehicle user to communicate with or through a component of the vehicle. The pushbutton(s) 52 allow manual user input into the communications module 30 to provide other data, response, and/or control input. Audio system 56 provides audio output to a vehicle occupant and can be a dedicated, stand-alone system or part of the primary vehicle audio system. Microphone 54 provides audio input to the vehicle communications module 30 to enable the driver or other occupant to provide voice commands and/or carry out hands-free calling via the wireless carrier system 70. For this purpose, it can be connected to an on-board automated voice processing unit utilizing human-machine interface (HMI) technology known in the art. Visual display or touch screen 50 can be a graphics display and can be used to provide a multitude of input and output functions. Display 50 can be a touch screen on the instrument panel, a heads-up display, or a projector that can project graphics for viewing by a vehicle occupant. Various other vehicle-user interfaces can also be utilized, as the interfaces of FIG. 1 are only an example of one particular implementation.

Wireless carrier system 70 may be any suitable cellular telephone system. Carrier system 70 is shown as including a cellular tower 72; however, the carrier system 70 may include one or more of the following components (e.g., depending on the cellular technology): cellular towers, base transceiver stations, mobile switching centers, base station controllers, evolved nodes (e.g., eNodeBs), mobility management entities (MMEs), serving and PGN gateways, etc., as well as any other networking components required to connect wireless carrier system 70 with the land network 76 or to connect the wireless carrier system with user equipment (UEs, e.g., which can include telematics equipment in vehicle 12). Carrier system 70 can implement any suitable communications technology, including GSM/GPRS technology, CDMA or CDMA2000 technology, LTE technology, etc. In general, wireless carrier systems 70, their components, the arrangement of their components, the interaction between the components, etc. is generally known in the art.

Land network 76 may be a conventional land-based telecommunications network that is connected to one or more landline telephones and connects wireless carrier system 70 to remote computer 78. For example, land network 76 may include a public switched telephone network (PSTN) such as that used to provide hardwired telephony, packet-switched data communications, and the Internet infrastructure. One or more segments of land network 76 could be implemented through the use of a standard wired network, a fiber or other optical network, a cable network, power lines, other wireless networks such as wireless local area networks (WLANs), networks providing broadband wireless access (BWA), or any combination thereof.

The computers 78 (only one shown) can be some of a number of computers accessible via a private or public network such as the Internet. The computers 78 can be a part of a remote facility that is used to provide backend vehicle services, such as for purposes of providing information to the vehicle for use in the vehicle's operation. The computers 78 can be connected to one or more databases or networks that stores vehicle information, such as resistance set (or threshold) values for different types of vehicles or vehicle electronic systems, as discussed more below. The computers 78 can act as server that can provide this information to one or more vehicles via a remote or long-range wireless connection, such as via land network 76 and cellular carrier system 70.

Figure 2:
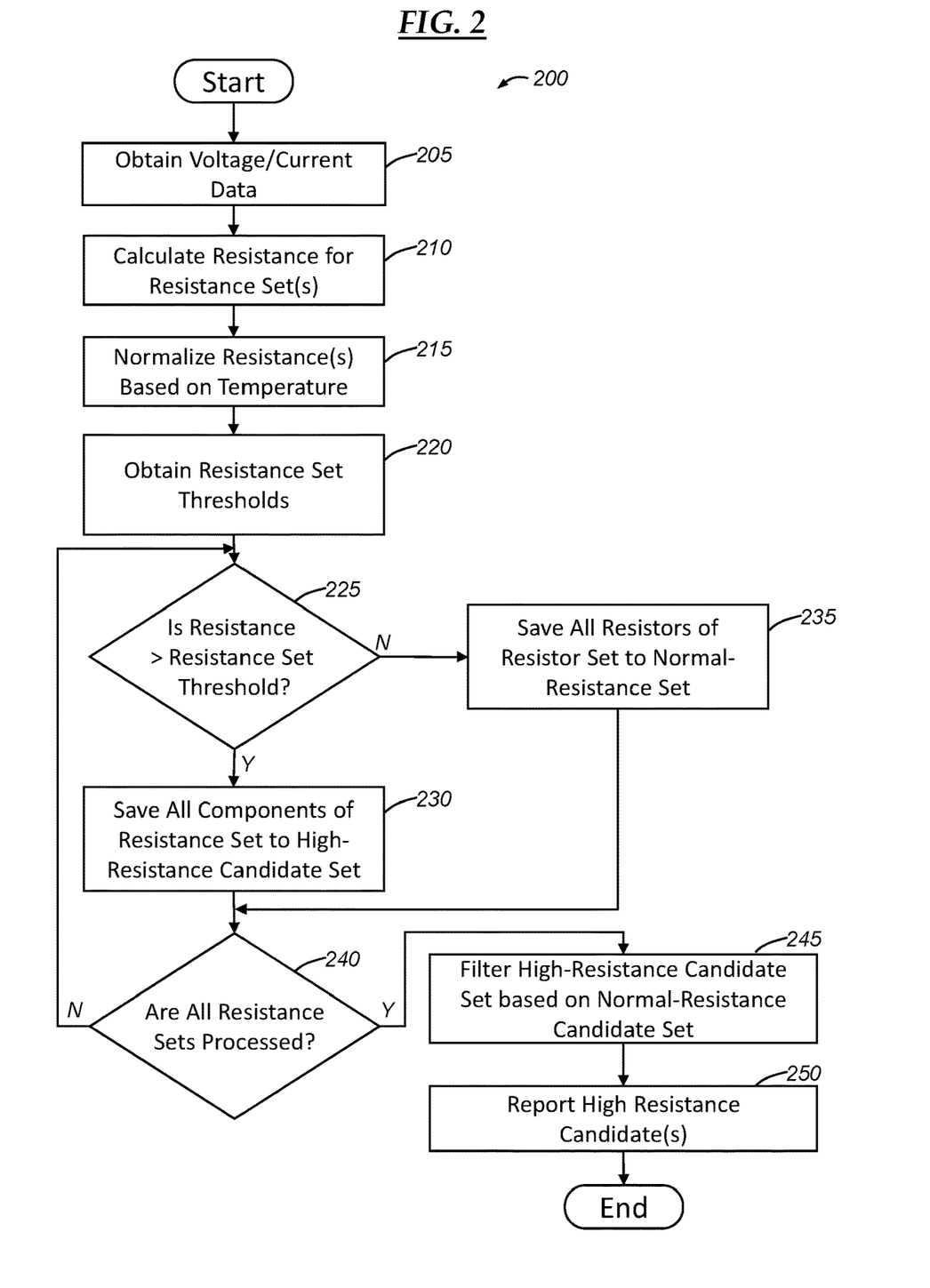
FIG. 2 is a flowchart depicting an embodiment of a method of detecting and isolating a high-resistance fault in vehicle electronics of a vehicle.

FIG. 2 illustrates a flow chart depicting an exemplary method 200 of detecting and isolating a high-resistance fault in vehicle electronics of a vehicle. The method 200 can be carried out by a vehicle electronics high-resistance fault diagnosis system, which can include a battery, a controller, one or more voltage and/or current sensors, and a target VSM that is powered by the battery. The target VSM or subsystem is a VSM or subsystem that is being evaluated for having or causing a high-resistance fault. As used herein, "subsystem" broadly refers to one or more VSMs (and/or other vehicle components) that operate to carry out a particular group of related, electronically-controlled vehicle functions. The controller can include a processor and memory, and the processor can be configured to carry out one or more steps of the method 200, which may be embodied in a computer program product stored on the memory (or on the memory of another VSM of the vehicle electronics). It should be understood that it is not necessary for the steps in method 200 to be performed in the particular order or sequence shown and described, and that the steps can be carried out in any technically-feasible order.

The method 200 is described below with reference to the exemplary circuit 300 of FIG. 3. The exemplary circuit 300 includes the vehicle battery 22, the electronic power steering (EPS) module 44, and other vehicle circuitry. The circuit 300 includes a common path 310 that is then split into two parallel paths at circuit split point 302. These two parallel paths 306, 308 are then rejoined into a single path at point 304. The first path 306 includes the EPS module 44 as well as three connectors (312, 314, 316). In one exemplary embodiment, the connector EMFC1 is an EPS+Mega Fuse Connector, the connector EPC is an EPS 2-way connector, and the EGC connector is an EPS Ground Connector. These connectors 312-316 can each have a corresponding resistance ($R_{EMFC1}$, $R_{EPC}$, $R_{EGC}$). The second path 308 represents other VSMs or parts of the vehicle electronics 20, including other connectors and VSMs. For example, as depicted, this second path 308 includes other VSM 60 and connector 318, which is associated with the resistance $R_{EMFC2}$. The battery 22 can be connected to the fuse box 42 via connectors 322 and 324, which are connected to the positive terminal 24 and the negative terminal 26, respectively. The battery positive connector (BPC) 322 is associated with the resistance $R_{BPC}$ and the battery negative connector (BNC) 324 is associated with the resistance $R_{BNC}$. The voltage of the battery 22 is represented by $V_B$, the current of the battery is represented by $I_B$, the current of the EPS (or path 306) is represented by $I_{EPS}$, the voltage of the EPS motor (or the EPS circuit that is a part of the path 306 and between the connector 314 and 316) is represented by $V_{EPS}$, the voltage of the path 308 is represented by $V_1$, and the voltage across the connector 316 is measured as $V_{EGC}$.

Figure 3:
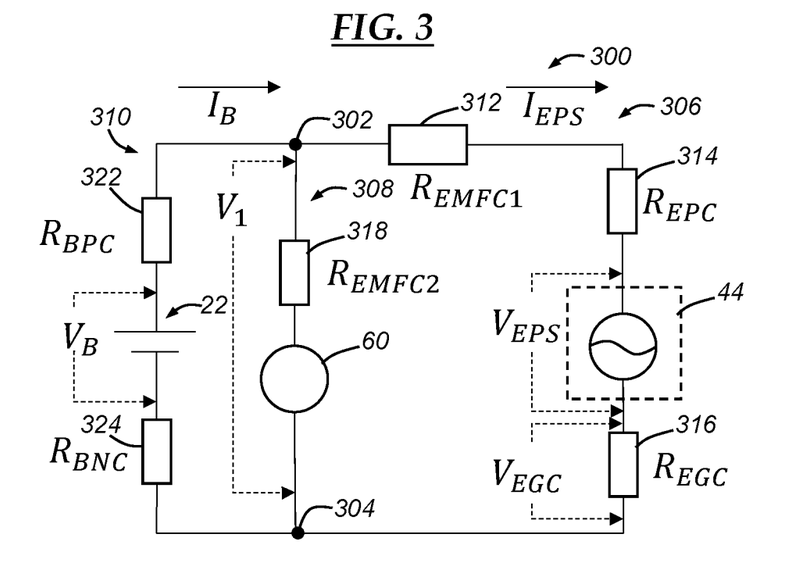
FIG. 3 is a circuit diagram depicting an embodiment of certain components of the vehicle electronics of the vehicle of FIG. 1.

In one exemplary embodiment, the voltages and currents illustrated in FIG. 3, except for voltage $V_1$, represent voltages and currents that can be readily measured or estimated. For example, the voltage $V_B$ can be obtained by BMS 28, which can include a voltage sensor (or voltmeter) coupled to the battery 22. As another example, the voltage $V_{EGC}$ can be measured by a voltmeter (or other sensor) that is coupled to or capable of measuring the voltage across the EPS 44. And, as yet another example, the voltage $V_{EGC}$ can represent the voltage across the component 316, which can be coupled to the communications bus (e.g., CAN bus) 40. This voltage $V_{EGC}$ can be obtained by measuring the voltage of CAN signals that were sent from the EPS 44. For example, the CAN bus can use a predetermined voltage (e.g., 2.5V) for a logical "1" and, based on the measured voltage of the CAN signals from the EPS 44, the voltage $V_{EGC}$ can be determined—thus, when the voltage of a message on the CAN bus from the EPS 44 is 3.5 V, it can be determined (or assumed) that the voltage $V_{EGC}$ is 1.0V. Thus, the resistance of the connector 316 (which is represented as $R_{EGC}$) can be determined through use of $V_{EGC}$ and $I_{EPS}$. It should be appreciated that the exemplary circuit 300 has been simplified for exemplary purposes and that one skilled in the art would understand how to apply the method and principles discussed herein to other circuits.

As mentioned, the method 200 is described below with respect to the exemplary circuit 300 of FIG. 3. Although the method 200 and the equations below are used for carrying out the method 200 for the exemplary circuit 300, those skilled in the art will appreciate how to apply these principles to circuits of varying architectures. For example, those skilled in the art will appreciate how to derive like equations for different circuits and how to then identify common paths of resistance so as to obtain resistance sets for a given circuit. These resistance sets are subject to the architecture and the precise voltage, current, and resistance measurement or estimation capabilities of the system to which the method 200 is being applied. Method 200 is not limited to any particular architecture, circuitry, etc.

The method 200 begins with step 205, wherein electrical data is obtained for one or more portions of the vehicle electronics. The electrical data includes voltage and/or current data. And, in one embodiment, the one or more portions of the vehicle electronics can include one or more target VSMs. In many embodiments, voltage and current information is obtained for the vehicle battery and the target VSM(s). The particular voltage and current measurements can be constructed based on the particular vehicle electronics circuit that is being evaluated. As an example, the circuit 300 can be evaluated using the method 200 and, in such a case, the battery voltage $V_B$ and the battery current $I_B$ can be measured by the BMS 28, the voltage of the target VSM (which in this case is the EPS and represented by $V_{EPS}$) can be measured as shown, and the current of the target VSM path (which is represented by $I_{EPS}$) can be determined or otherwise measured. In some embodiments, one or more of these values can be estimated instead of (or in addition to) being measured using a sensor. For example, the target VSM current $I_{EPS}$ can be estimated based on a circuit schematic and/or technical specifications of the vehicle electronics. This estimated value can be a value that is preprogrammed into memory, or can be obtained at the time of carrying out step 210. In one embodiment, the estimated value can be derived based on other vehicle sensor readings, such as other VSM current, voltage, resistance, or other sensor readings. The method 200 continues to step 210.

In step 210, the resistance for a plurality of resistance sets is calculated. As used herein, a resistance set is a set of one or more resistances of one or more electrical components of the evaluated circuit. In one embodiment, a resistance set can include components that are a part of the same circuit path. For example, a first resistance set $RS_1$ can include connectors (or components) 312-316, a second resistance set $RS_2$ can include connectors (or components) 322 and 324, and a third resistance set $RS_3$ can include only the resistance $R_{EGC}$ for connector 316. In this example, the following equations can be derived using standard circuit calculations and principles:

$$\frac{V_1 - V_{EPS}}{I_{EPS}} = R_{EMFC1} + R_{EPC} + R_{EGC} \quad (1)$$

$$V_1 = V_B - I_B * (R_{BPC} + R_{BNC}) \quad (2)$$

These equations can then be used to eliminate $V_1$ so as to obtain Equations (3) and (4) below:

$$\frac{V_B - I_B * (R_{BPC} + R_{BNC}) - V_{EPS}}{I_{EPS}} = R_{EMFC1} + R_{EPC} + R_{EGC} \quad (3)$$

$$\frac{V_B - V_{EPS}}{I_{EPS}} = R_{EMFC1} + R_{EPC} + R_{EGC} + \frac{I_B * (R_{BPC} + R_{BNC})}{I_{EPS}} \quad (4)$$

Equation (4) can be generalized so that it can be applied to other scenarios that have a similar design in that the electrical components of resistance set $RS_1$ are along the target circuit path 306 and the electrical components of resistance set $RS_2$ are provided on the common path 310:

$$RS_1 + a \times RS_2 = b \quad (5)$$

$$\text{where } a = \frac{I_B}{I_T} \text{ and } b = \frac{V_B - V_T}{I_T}$$

where $RS_1$ is the overall resistance attributed to the connectors $R_{EMFC1}$, $R_{EPC}$, and $R_{EGC}$, $RS_2$ is the overall resistance attributed to the connectors $R_{BPC}$ and $R_{BNC}$, $I_B$ is the current of the battery, $I_T$ is the current of the target VSM or the current along the first circuit path 306 (which is $I_{EPS}$ in the exemplary circuit 300), $V_B$ is the voltage of the battery as measured along a portion of the common circuit path 310 that does not include connectors of the second resistance set $RS_2$, and $V_T$ is the voltage of the target VSM as measured along a portion of the first circuit path 306 that does not include the electrical components of the first resistance set $RS_1$ (which is $V_{EPS}$ in the exemplary circuit 300). Thus, Equation (5) can be used for circuits in which the battery voltage $V_B$ and battery current $I_B$ is known or can be estimated and where the target VSM voltage $V_T$ and current $I_T$ is known or can be estimated.

Equations (1)-(5) are specific to the exemplary circuit 300 (or circuits with similar topology) in which the electrical components of the first resistance set $RS_1$ are disposed along the first circuit path 306 that includes the target VSM and the electrical components of the second resistance set $RS_2$ are disposed along the common circuit path 310 that includes the battery 322. It should be appreciated that the battery voltage $V_B$ is measured across the battery 22 and that this measurement is taken at two points along the common circuit path 310 such that the electrical components of the second resistance set $RS_2$ are outside these two points such that this measurement (or estimate) does not take into consideration the resistance of the electrical components of the second resistance set $RS_2$. The same is true for the target voltage $V_T$ with respect to the electrical components of the first resistance set $RS_1$.

The battery voltage $V_B$, the battery current $I_B$, the target VSM voltage $V_T$, and the target VSM current $I_T$ can be measured and/or estimated at various times to obtain various values for a and b. For example, the battery voltage $V_B$, the battery current $I_B$, the target VSM voltage $V_T$, and the target VSM current $I_T$ can be measured, estimated, or otherwise determined for time $t_1$ so as to obtain values $a_1$ and $b_1$. The same can be done for time $t_2$ to obtain values $a_2$ and $b_2$. Then, the two unknown variables, resistances for $RS_1$ and $RS_2$, can be calculated. In some embodiments, various filtering techniques can be applied to estimate the resistance of the first resistance set $RS_1$ and the second resistance set $RS_2$ recursively, such as a recursive least squares technique, a Kalman filter, and/or a particle filter. Once the resistance for the resistance sets has been calculated or estimated, the method 200 continues to step 215.

In step 215, the resistances for the resistance sets are normalized based on temperature. This step is optional, as it may be omitted in some embodiments. In some embodiments, the temperature of (or surrounding) the target VSM and/or vehicle battery can be measured, estimated, or otherwise obtained. In one embodiment, this temperature can take into consideration the ambient temperature of the environment in which the vehicle is operating—for example, the vehicle can obtain weather information for the location of the vehicle from a remote server or computer, such as computer 78. And, alternatively or additionally, the temperature can be obtained based on one or more sensor readings from one or more onboard vehicle sensors, such as from one or more digital thermometers or thermistors. Once the temperature is obtained, the resistances can be normalized based on this temperature. In one embodiment, the vehicle can include a resistance-temperature normalization table that is (or functions as) a look-up table so that a temperature can be looked-up and used to normalize (or adjust) the resistances of the resistance sets. In another embodiment, a resistance-temperature normalization equation can be used that takes as input the temperature and the resistances, and then outputs an adjusted resistance. The method 200 then continues to step 220.

In step 220, the resistance set thresholds are obtained for each of the resistance sets. The resistance set thresholds can be stored in memory of the vehicle electronics 20, such as in memory 38 of the vehicle communications module 30 or other VSM. In another embodiment, the resistance set thresholds can be stored at a remote server, such as remote computer 78, and may be downloaded from the remote server and then stored in memory of the vehicle electronics 20. In one embodiment, the resistance set thresholds are calculated or made available based on an engineering specification of the vehicle electronics 20. In another embodiment, the vehicle can obtain and record initial resistance(s) of the resistance sets (as determined using Equations (1)-(5) above, for example) when the vehicle 12 is newly manufactured and operated. Then, after the vehicle has reached a certain age, such as a certain mileage threshold, these recorded resistances of the resistance sets can be used as resistance set thresholds in step 225. In another embodiment, a remote facility (or server system) can obtain various resistance measurements from a plurality (or fleet) of vehicles and, then, average or representative resistances for the resistance sets can be obtained. These representative resistances can then be used by the method in determining whether the resistance of a particular resistance set is too high (or indicates a high-resistance fault) (step 225). The representative resistances can be calculated from a plurality of vehicles that are of the same model/model-year as the vehicle 12, or that otherwise have the same (or similar) vehicle electronics architecture, for example. Once the resistance set thresholds are obtained, the method 200 continues to step 225.

As illustrated in FIG. 2, steps 225-235 are carried out for each resistance set and, when all resistance sets are processed (step 240), then the method 200 continues to step 245. In step 225, the resistance of the first resistance set $RS_1$ is compared to the resistance threshold for that resistance set. When it is determined that the resistance of the first resistance set $RS_1$ is greater than the first resistance set threshold, the method 200 continues to step 230; otherwise, the method 200 continues to step 235. In step 230, the electrical components of the first resistance set are saved to a high-resistance candidate set or otherwise marked as a high-resistance candidate. The high-resistance candidate set includes electrical components that have been identified as potentially being the cause of the high-resistance fault and may be identified as such based on their association with a resistance set that has exceeded its resistance set threshold (step 225). In step 235, the electrical components of the resistance set are saved to a normal-resistance set, which includes electrical components that have been identified as not being the cause of (or contributing to) the high-resistance fault based on their association with a resistance set that has not exceeded its resistance set threshold (step 225). As illustrated in step 240, once all resistance sets have been processed according to steps 225-235, the method 200 continues to step 245.

In step 245, the high-resistance candidate set is filtered based on the normal-resistance set to narrow down the candidates that may be the cause of the high-resistance fault (e.g., by process of elimination). In many embodiments, the following equation can be applied:

$$RS_C = RS_H - RS_H \cap RS_N \quad (6)$$

where $RS_C$ is the final (or filtered) high-resistance candidate set, $RS_H$ is the high-resistance candidate set (obtained from step 230), and $RS_N$ is the normal-resistance set (obtain from step 235). Thus, the filtered high-resistance candidates set $RS_C$ includes the electrical components of the high-resistance candidate set $RS_H$ that are not also a part of the normal-resistance set $RS_N$. In some embodiments, the high-resistance candidate set $RS_H$ and the normal-resistance set $RS_N$ may not include any common electrical components and, thus, the high-resistance candidate set $RS_H$ is not filtered down any more—in such instances, the final high-resistance candidate set includes the same electrical components as the high-resistance candidate set $RS_H$. Also, in these cases, although the final high-resistance candidate set is not furthered filtered down using Equation (6), the method can still indicate which of the resistance sets includes electrical components that are (or may be) the cause of (or at least contributing to) the high-resistance fault.

As mentioned above, the following three resistance sets can be obtained based on the exemplary circuit 300:

$RS_1 = \{R_{EMFC1}, R_{EPC}, R_{EGC}\}$ $RS_2 = \{R_{BPC}, R_{BNC}\}$ $RS_3 = \{R_{EGC}\}$

In one exemplary scenario, it can be determined that the resistances of the second resistance set $RS_2$ and the third resistance set $RS_3$ ($R_{EGC}$) are normal (i.e., not above the resistance set threshold for the associated resistance set) and that the resistance of the first resistance set $RS_1$ is high (i.e., above the resistance set threshold for the associated resistance set). Thus, through using the method 200, it can be determined that the filtered (or final) high-resistance candidate set is $RS_C = \{R_{EMFC1}, R_{EPC}\}$. In this example, the connector associated with $R_{EGC}$ (or component 316) was eliminated from the high-resistance candidate set since it was a part of a resistance set that was of the normal resistance range (i.e., the third resistance set $RS_3$). The method 200 continues to step 250.

In step 250, the final high-resistance candidate set is reported. In one embodiment, this can include notifying a vehicle user using one or more vehicle-user interfaces, such as display 50 or audio system 56. Alternatively or additionally, a remote server or system can be notified, such as a backend vehicle services facility, or an application of a vehicle user's personal mobile device (e.g., smart phone) can be notified. A notification can be presented that indicates or otherwise identifies the high-resistance candidates and/or their associated VSM. In another embodiment, the vehicle can process the high-resistance candidate set along with other vehicle information, such as vehicle sensor information or diagnostic information (e.g., diagnostic trouble codes (DTCs)), to obtain a vehicle prognosis. The vehicle prognosis can indicate information pertaining to one or more issues with the vehicle, the vehicle electronics, or one or more particular VSMs of the vehicle electronics. The method 200 then ends.

Figure 4:
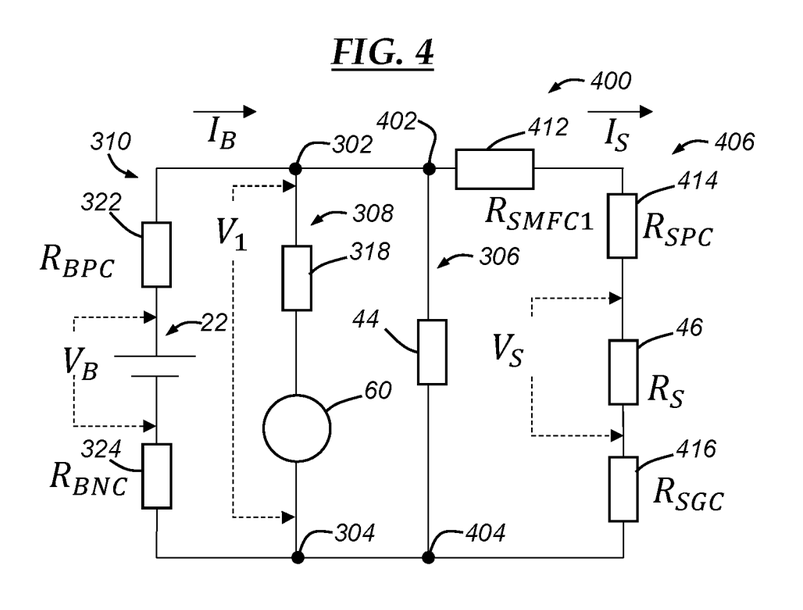
FIG. 4 is a circuit diagram depicting an embodiment of certain components of the vehicle electronics of the vehicle of FIG. 1.

FIG. 4 illustrates an exemplary circuit 400 of the vehicle electronics that can be evaluated for a high-resistance fault. The exemplary circuit 400 includes the vehicle battery 22, the electronic power steering (EPS) module 44, the starter circuit 46, and other vehicle circuitry that is in parallel with the EPS module 44 and the start circuit 46. The circuit 400 includes the circuit 300 of FIG. 3, and also illustrates a third circuit path 406 that is then split from the parallel paths (306, 308) at circuit split point 402 and that reconnects at circuit split point 404. The first circuit path 306 and the second circuit path 308 can include those same connectors, components, and VSM(s) (e.g., the EPS 44) as discussed above with respect to FIG. 3.

The starter circuit 46 can be energized or provided electrical power when the vehicle 12 is being started, such as when a vehicle user turns an ignition key to the START position. In such an instance, for example, the vehicle battery 22 can provide electrical power to the start circuit 46 and, in many embodiments, the vehicle electronics 20 can be configured to provide a high amount of current to the starter circuit 46. In such cases, the current of the starter circuit $I_S$ is the same as (or substantially equal to) the current of the battery $I_B$. The following equation can be derived based on this circuit 400:

$$\frac{V_B - I_B * (R_{BPC} + R_{BNC}) - V_S}{I_S} = R_{SMFC1} + R_{SPC} + R_{SGC} \quad (7)$$

$$\frac{V_B}{I_B} = R_{SMFC1} + R_{SPC} + R_{SGC} + R_S + R_{BPC} + R_{BNC} \quad (8)$$

where $V_S$ is the voltage of the starter circuit 46, $I_S$ is the current of the starter circuit 46, and $R_S$ is the resistance of the starter circuit 46. In some cases, it can be assumed that the battery current $I_B$ is equal to the starter circuit current $I_S$ since the vehicle electronics 20 directs all (or substantially all) current from the battery 22 to the starter circuit 46 for starting the vehicle 12. In such a case, Equation (7) can be simplified to obtain Equation (8), which provides a means of calculating a fourth resistance set $RS_4$:

$$RS_4 = \{RS_{SMFC1}, R_{SPC}, R_{SGC}, R_S, R_{BPC}, R_{BNC}\}$$

This resistance of the fourth resistance set $RS_4$ can be used along with the first, second, and third resistance sets to further isolate the cause of the high-resistance fault, such as through using Equation (6) above. And, in some embodiments, this resistance of the fourth resistance set $RS_4$ can be used to determine whether a high-resistance fault was erroneously detected. For example, using the first, second, and third resistance sets in the method 200 may indicate that a high-resistance fault occurred with respect to the electrical components of the resistance set $RS_2$ ($R_{BPC}$, $R_{BNC}$). However, if the resistance of the fourth resistance set $RS_4$, which includes $R_{BPC}$ and $R_{BNC}$, is normal, then it may be determined that there is no high-resistance fault or that the high-resistance fault is not to be reported. Or, in such a case, the high-resistance fault can be reported to a vehicle backend facility, but not presented to a vehicle user as it may be unclear as to whether a problem with the vehicle electronics actually exists (or whether the method simply resulted in a false positive).

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater or different steps than that shown here. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation. In addition, the term "and/or" is to be construed as an inclusive or. As an example, the phrase "A, B, and/or C" includes: "A"; "B"; "C"; "A and B"; "A and C"; "B and C"; and "A, B, and C."

The invention claimed is:

1. A method of detecting and isolating a high-resistance fault in vehicle electronics of a vehicle, the method comprising the steps of:

determining electrical data for one or more portions of the vehicle electronics, wherein the electrical data includes voltage data and/or current data concerning the one or more portions of the vehicle electronics;

calculating a resistance for a plurality of resistance sets of the vehicle electronics based on the electrical data, wherein each of the plurality of resistance sets includes one or more electrical components, and at least one of the plurality of resistance sets includes a plurality of electrical components;

obtaining a resistance set threshold for each of the plurality of resistance sets of the vehicle electronics;

for each of the plurality of resistance sets, evaluating whether the resistance of the resistance set exceeds the resistance set threshold; and based on the evaluating step, identifying one or more high-resistance fault candidates, wherein the one or more high-resistance fault candidates includes at least one of the electrical component(s) from one or more of the resistance sets.

2. The method of claim 1, wherein the determining step includes using an onboard vehicle sensor to measure a current of at least some of the one or more portions of the vehicle electronics.

3. The method of claim 1, wherein the determining step includes using an onboard vehicle sensor to measure a voltage of at least some of the one or more portions of the vehicle electronics.

4. The method of claim 3, wherein the one or more portions of the vehicle electronics are provided electrical power by a vehicle battery that is a part of the vehicle electronics, and wherein the measured voltage is a vehicle battery voltage that is measured using the onboard vehicle sensor.

5. A method of detecting and isolating a high-resistance fault in vehicle electronics of a vehicle, the method comprising the steps of:

determining electrical data for one or more portions of the vehicle electronics, the electrical data includes voltage data and/or current data concerning the one or more portions of the vehicle electronics;

calculating a resistance for a plurality of resistance sets of the vehicle electronics based on the electrical data, wherein each of the plurality of resistance sets includes one or more electrical components;

obtaining a resistance set threshold for each of the plurality of resistance sets of the vehicle electronics;

for each of the plurality of resistance sets, evaluating whether the resistance of the resistance set exceeds the resistance set threshold; and based on the evaluating step, identifying one or more high-resistance fault candidates, the one or more high-resistance fault candidates includes at least one of the electrical component(s) from one or more of the resistance sets, wherein the determining step includes estimating at least some of the electrical data based on a known circuit configuration of the one or more portions of the vehicle electronics.

6. The method of claim 1, wherein at least one electrical component of the plurality of electrical components of the at least one resistance set is a member of another one of the resistance sets.

7. The method of claim 1, wherein the method further includes creating a high-resistance candidate set and a normal-resistance candidate set based on the evaluating step, and wherein the identifying step further includes filtering down the high-resistance candidate set based on the normal-resistance candidate set to obtain a filtered high-resistance candidate set.

8. The method of claim 1, wherein the resistance set thresholds are obtained from memory included as a part of the vehicle electronics.

9. The method of claim 8, wherein at least one of the resistance set thresholds is obtained based on a measured or calculated resistance value for the resistance set at a time prior to carrying out the method and when an overall mileage of the vehicle is below a predetermined threshold, and wherein the at least one resistance set threshold is stored in the memory.

10. The method of claim 8, wherein at least one of the resistance set thresholds is determined based on engineering specifications of the vehicle electronics and is stored in the memory.

11. The method of claim 1, wherein at least one of the resistance set thresholds is obtained at the vehicle electronics from a remote server.

12. The method of claim 11, wherein the at least one resistance set threshold is determined based on onboard sensor data from a plurality of vehicles, and wherein the plurality of vehicles include a similar vehicle electronics architecture as the vehicle.

13. The method of claim 1, wherein the vehicle electronics includes an electronic controller, wherein the electronic controller includes a processor and memory, and wherein the processor is configured to carry out the method based on computer instructions stored in the memory.

14. A method of detecting and isolating a high-resistance fault in vehicle electronics of a vehicle, the method comprising the steps of:

determining electrical data for one or more portions of the vehicle electronics, wherein the electrical data includes voltage data and/or current data concerning a battery and a target vehicle system module (VSM) of the vehicle electronics;

calculating a resistance for a plurality of resistance sets of the vehicle electronics based on the electrical data;

obtaining a resistance set threshold for each of the plurality of resistance sets of the vehicle electronics;

for each of the plurality of resistance sets, evaluating whether the resistance of the resistance set exceeds the resistance set threshold;

based on the evaluating step, populating a high-resistance candidate set that includes one or more electrical components of each resistance set that is determined to have exceeded the resistance set threshold; and identifying one or more high-resistance fault candidates, wherein the one or more high-resistance fault candidates includes at least one of the electrical component(s) from one or more of the resistance sets determined to have exceeded the resistance set threshold.

15. The method of claim 14, wherein the method further comprises the step of notifying a vehicle user via one or more vehicle-user interfaces installed as a part of the vehicle electronics of the vehicle.

16. The method of claim 14, wherein the method further comprises the step of sending a notification to a backend vehicle services facility via use of a vehicle communications module installed as a part of the vehicle electronics of the vehicle.

17. The method of claim 16, wherein the vehicle communications module is a telematics unit.

18. The method of claim 14, wherein the method further comprises the step of normalizing the calculated resistances based on a temperature of the vehicle or an ambient temperature of the vehicle.

* * * * *